(12) United States Patent
Kim et al.

(10) Patent No.: US 9,110,233 B2
(45) Date of Patent: Aug. 18, 2015

(54) SEMICONDUCTOR DEVICES

(71) Applicant: SAMSUNG ELECTRONICS CO., LTD., Suwon-si, Gyeonggi-do (KR)

(72) Inventors: Ki-Chul Kim, Seongnam-si (KR); Bong-Jin Kuh, Suwon-si (KR); Jung-Yun Won, Hwaseong-si (KR); Eun-Ha Lee, Seoul (KR); Han-Mei Choi, Seoul (KR)

(73) Assignee: SAMSUNG ELECTRONICS CO., LTD., Suwon-Si, Gyeonggi-Do (KR)

( * ) Notice: Subject to any disclaimer, the term of this patent is extended or adjusted under 35 U.S.C. 154(b) by 333 days.

(21) Appl. No.: 13/726,346

(22) Filed: Dec. 24, 2012

(65) Prior Publication Data

US 2013/0170784 A1  Jul. 4, 2013

(30) Foreign Application Priority Data

Jan. 2, 2012 (KR) .................... 10-2012-0000052

(51) Int. Cl.
| | |
|---|---|
| *G02F 1/035* | (2006.01) |
| *G02B 6/122* | (2006.01) |
| *G02B 6/124* | (2006.01) |
| *G02F 1/025* | (2006.01) |
| *G02B 6/132* | (2006.01) |
| *G02B 6/12* | (2006.01) |

(52) U.S. Cl.
CPC ............... *G02B 6/122* (2013.01); *G02B 6/124* (2013.01); *G02F 1/025* (2013.01); *G02F 1/035* (2013.01); *G02B 6/132* (2013.01); *G02B 2006/12061* (2013.01)

(58) Field of Classification Search
CPC ........ G02B 6/132; G02B 6/122; G02B 6/124; G02B 2006/12061
USPC ........................................ 385/3, 14
See application file for complete search history.

(56) References Cited

U.S. PATENT DOCUMENTS

| | | | | | |
|---|---|---|---|---|---|
| 4,114,257 | A | * | 9/1978 | Bellavance ................. | 438/24 |
| 5,982,002 | A | * | 11/1999 | Takasu et al. .............. | 257/347 |
| 6,881,651 | B2 | | 4/2005 | Koide et al. | |
| 8,909,021 | B2 | * | 12/2014 | Saito et al. ................ | 385/147 |
| 2002/0159683 | A1 | * | 10/2002 | Helin et al. ................ | 385/18 |
| 2004/0126948 | A1 | * | 7/2004 | Lee .......................... | 438/197 |
| 2004/0240821 | A1 | * | 12/2004 | Vernon et al. ............. | 385/130 |

(Continued)

FOREIGN PATENT DOCUMENTS

KR   10-2010-0062213   6/2010

OTHER PUBLICATIONS

English Abstract for Publication No. 10-2010-0062213.

*Primary Examiner* — Ryan Lepisto
*Assistant Examiner* — Guy Anderson
(74) *Attorney, Agent, or Firm* — F. Chau & Associates, LLC

(57) ABSTRACT

A semiconductor device includes a single crystalline substrate, an electrical element and an optical element. The electrical element is disposed on the single crystalline substrate. The electrical element includes a gate electrode extending in a crystal orientation <110> and source and drain regions adjacent to the gate electrode. The source region and the drain region are arranged in a direction substantially perpendicular to a direction in which the gate electrode extends. The optical element is disposed on the single crystalline substrate. The optical element includes an optical waveguide extending in a crystal orientation <010>.

13 Claims, 13 Drawing Sheets

(56) References Cited

U.S. PATENT DOCUMENTS

| | | |
|---|---|---|
| 2005/0231855 A1* | 10/2005 | Tran .......................... 360/324.1 |
| 2006/0202276 A1* | 9/2006 | Kato ............................. 257/368 |
| 2010/0002978 A1* | 1/2010 | Park et al. ....................... 385/2 |
| 2010/0006973 A1 | 1/2010 | Kohyama |
| 2010/0133647 A1 | 6/2010 | Kim et al. |
| 2011/0150386 A1* | 6/2011 | Dupuis et al. ................. 385/14 |
| 2011/0194803 A1* | 8/2011 | Shin et al. ........................ 385/3 |
| 2013/0343696 A1* | 12/2013 | Kim et al. ..................... 385/14 |
| 2014/0231803 A1* | 8/2014 | Yamazaki ...................... 257/43 |
| 2014/0241660 A1* | 8/2014 | Taylor .............................. 385/8 |
| 2014/0252415 A1* | 9/2014 | Nayfeh ......................... 257/194 |

\* cited by examiner

SEMICONDUCTOR DEVICES

CROSS-REFERENCE TO RELATED APPLICATION

This application claims under 35 USC §119 priority to and the benefit of Korean Patent Application No. 10-2012-0000052 filed on Jan. 2, 2012 in the Korean Intellectual Property Office (KIPO), the entire contents of which are incorporated by reference herein.

BACKGROUND

1. Technical Field

The present disclosure relates to semiconductor devices having optical elements and methods of manufacturing the same.

2. Discussion of the Related Art

To improve the data transmission rate between semiconductor devices, data needs to be transmitted optically as well as electrically. To implement this, several studies have been conducted to form both an electrical element and an optical element on the same substrate.

When a buried oxide layer and a single crystalline silicon or germanium layer is formed on a silicon substrate or a germanium substrate, and an electrical element and an optical element are formed on the single crystalline layer, optical characteristics of the optical element, especially an optical waveguide characteristic, may be deteriorated depending on a crystallinity of the single crystalline layer.

SUMMARY

According to exemplary embodiments, a semiconductor device including both of an electrical element and an optical element is provided, wherein the optical element has improved optical waveguide characteristics.

According to an exemplary embodiment, a method of manufacturing a semiconductor device including both of an electrical element and an optical element is provided, wherein the optical element has improved optical waveguide characteristics.

According to an exemplary embodiment, a semiconductor device includes a single crystalline substrate; an electrical element on the single crystalline substrate, the electrical element including a gate electrode extending in a crystal orientation <110> and source and drain regions adjacent to the gate electrode, the source region and the drain region arranged in a direction substantially perpendicular to a direction in which the gate electrode extends; and an optical element on the single crystalline substrate, the optical element including an optical waveguide extending in a crystal orientation <010>.

The optical waveguide may include a core layer and a cladding layer, the core layer comprising crystallized silicon, and the cladding layer surrounding the core layer.

The cladding layer may be of a material having a refractive index smaller than that of the core layer.

The cladding layer may be silicon oxide, silicon nitride or silicon carbon-nitride.

The core layer may be doped with impurities including phosphorous, bromine, arsenic or carbon.

The optical element may further include grating couplers, a phase converter and interferometers which are optically connected with the optical waveguide.

The semiconductor device may further include an epitaxial layer on the single crystalline substrate, wherein the gate electrode is on the epitaxial layer, and the source region and the drain region are at upper portions of the epitaxial layer.

The optical waveguide may be of a material substantially the same as that of the epitaxial layer.

According to an exemplary embodiment, a method of manufacturing a semiconductor device includes forming an optical element on a single crystalline substrate, the optical element comprising an optical waveguide extending in a crystal orientation <010>, and forming an electrical element comprising a gate electrode extending in a crystal orientation <110>, and source and drain regions adjacent to the gate electrode, the source and drain regions arranged in a direction substantially perpendicular to a direction in which the gate electrode extends.

Forming the optical element may include: forming a first cladding layer on the single crystalline substrate; forming an amorphous layer on the first cladding layer and the single crystalline substrate; crystallizing the amorphous layer to form an epitaxial layer having a crystal orientation substantially the same as that of the single crystalline substrate; partially removing the epitaxial layer to form a core layer extending in a crystal orientation <010>; and forming a second cladding layer on the first cladding layer to cover the core layer.

Prior to forming the first cladding layer, the method may include partially removing the single crystalline substrate to form a trench extending the crystal orientation <010>, wherein the first cladding layer partially fills the trench.

The first and second cladding layers may include silicon oxide, silicon nitride or silicon carbon nitride.

Forming the optical element may further include forming grating couplers and forming a phase converter, and the grating couplers and the phase converter may be optically connected with the optical waveguide.

Forming the electrical element may include: forming a buried insulation layer on the single crystalline substrate; forming an amorphous layer on the buried insulation layer; crystallizing the amorphous layer to form an epitaxial layer having a crystal orientation substantially the same as that of the single crystalline substrate; forming the gate electrode on the epitaxial layer, the gate electrode extending a crystal orientation <011>; and forming the source region and the drain region adjacent to the gate electrode, the source region and the drain region being at upper portions of the epitaxial layer.

The electrical element may include a dynamic random access memory (DRAM) device, a flash memory device, a phase-change random access memory (PRAM) device, a magnetic random access memory (MRAM) device, or a resistive random access memory (RRAM) device.

According to an exemplary embodiment, a semiconductor device includes: a single crystalline silicon wafer having a first region and a second region; an amorphous silicon layer on the single crystalline silicon wafer; an electrical element disposed in the first region; and an optical element disposed in the second region. The optical element includes an optical waveguide having an optical waveguide core formed by epitaxial regrowth of the amorphous silicon layer, the optical waveguide core extending in a direction of optimum regrowth of the amorphous silicon layer.

The optical element may further include a first grating coupler responsive to an input optical signal from an optical source; a first interferometer configured to divide the input optical signal into a first optical signal and a second optical signal that pass to a first optical wave path and a second optical wave paths, respectively, the first optical wave path being optically connected to a phase converter configured to convert a phase of the first optical signal, the second optical wave path being through the optical waveguide; a second interferometer configured to combine the first optical signal and the second optical; and a second grating coupler configured to output a combined first optical signal and second optical signal.

The phase converter may include a crystallized silicon core that extends in a same direction as the optical waveguide.

The crystallized silicon core may be responsive to an electrical signal from the electrical element, such that an electrical current applied to the crystallized silicon core can control a refractive index of the second core for converting a phase of the first optical signal.

The electrical element may include a transistor having a source, a drain, and a channel between the source and drain that extends in a direction from the first region towards the second region.

BRIEF DESCRIPTION OF THE DRAWINGS

Exemplary embodiments will be more clearly understood from the following detailed description taken in conjunction with the accompanying drawings.

DETAILED DESCRIPTION OF THE EMBODIMENTS

Figure 1:
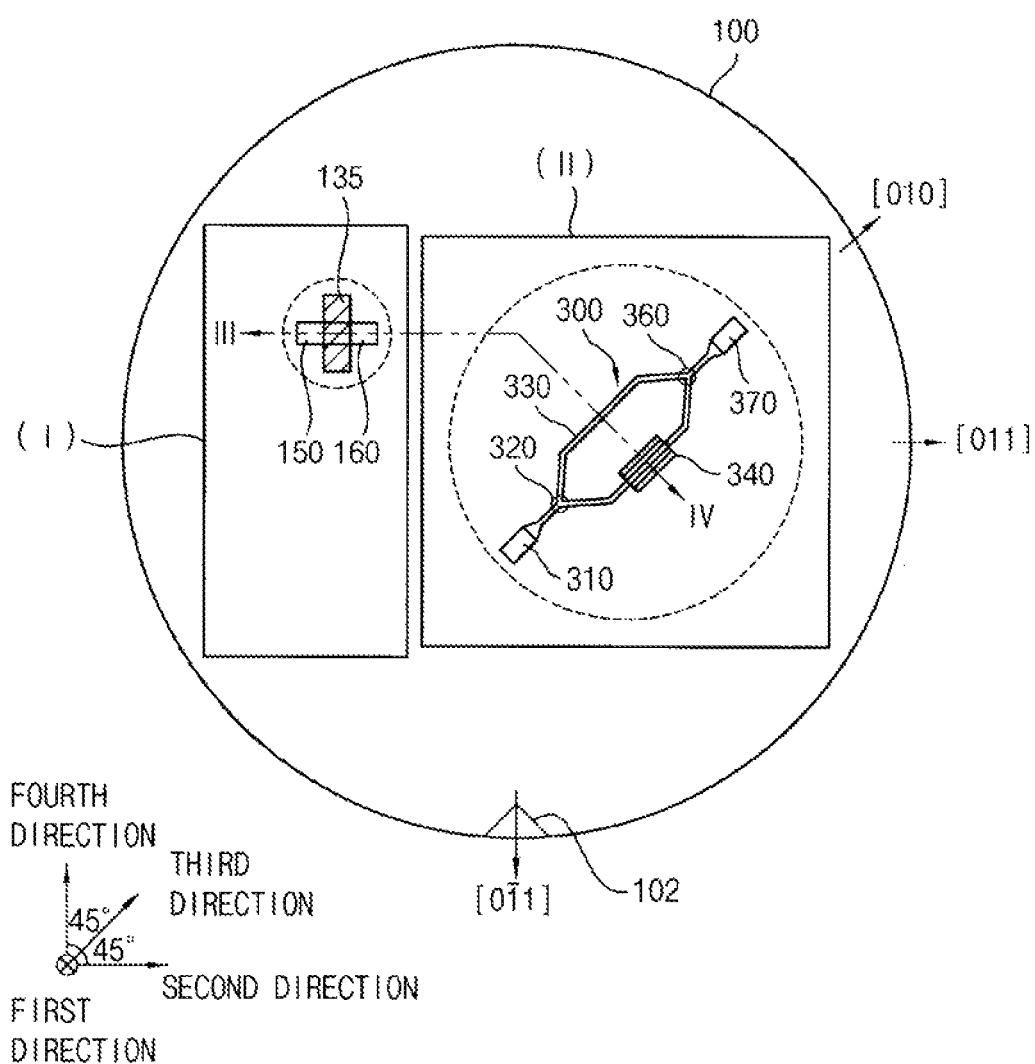
FIG. 1 is a plan view illustrating a semiconductor device including an optical element and an electrical element in accordance with exemplary embodiments.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Exemplary embodiments are described herein with reference to cross-sectional illustrations that are schematic illustrations of idealized exemplary embodiments (and intermediate structures). As such, variations from the shapes of the illustrations as a result, for example, of manufacturing techniques and/or tolerances, are to be expected. Thus, exemplary embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

For single crystal semiconductor materials, all lattice directions and lattice planes in a unit cell of a single crystal material may be described by a mathematical description known as a Miller Index. That is, the notation [hk1] in the Miller Index defines a crystal direction or orientation, such as the [001], [100], [010], [110], and [111] directions in a cubic unit cell of single crystal materials. The crystal planes or facets of a single crystal material unit cell are defined by the notation (hk1) in the Miller Index, which refers to a particular crystal plane or facet that is perpendicular to the [hk1] direction. For example, the crystal planes (100), (110), and (111) of the single crystal material unit cells are respectively perpendicular to the [100], [110], and [111] directions. The unit cells are periodic in a single crystal material, and thus there exist families or sets of equivalent crystal orientations and planes. The notation <hk1> in the Miller Index therefore defines a family or set of equivalent crystal directions or orientations. For example, a crystal orientation <100> includes the equivalent crystal orientations of [100], [010], [001], [−100], [0-10], and [00-1]; a crystal orientation <110> includes equivalent crystal orientations of [110], [011], [101], [−1-10], [0-1-1], [−10-1], [−110], [0-11], [−101], [1-10], [01-1], and [10-1]; and a crystal orientation <111> includes the equivalent crystal orientations of [111], [−111], [1-11], and [11-1]. Similarly, the notation {hk1} defines a family or set of equivalent crystal planes or facets that are respectively perpendicular to the <hk1> directions. For example, a crystal plane {100} includes the set of equivalent crystal planes that are respectively perpendicular to the crystal orientation <100>.

Hereinafter, exemplary embodiments will be explained in detail with reference to the accompanying drawings.

Figure 2:
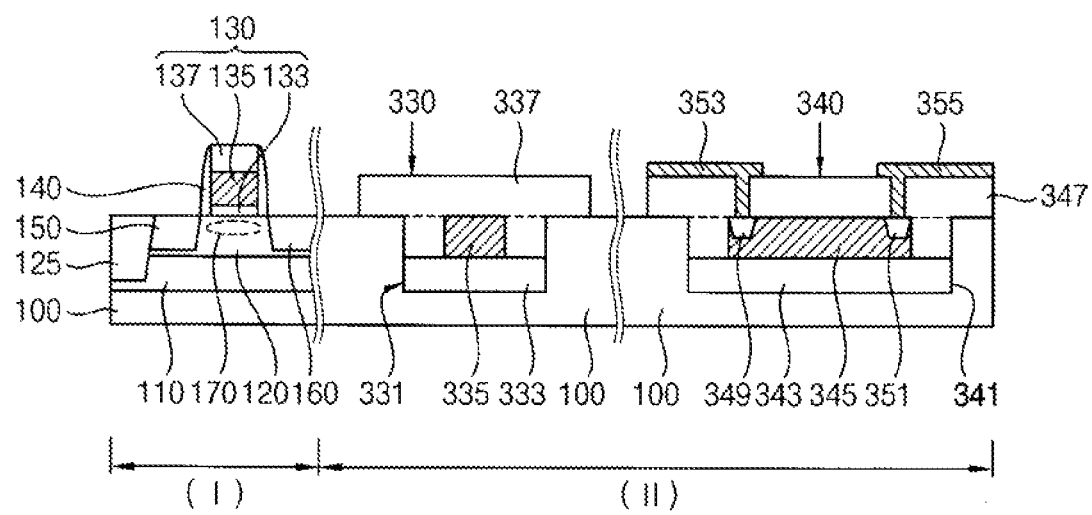
FIG. 2 is a cross-sectional view illustrating the semiconductor device cut along a line III-IV in FIG. 1.

FIG. 1 is a plan view illustrating a semiconductor device including both an optical element and an electrical element in accordance with an exemplary embodiment, and FIG. 2 is a cross-sectional view illustrating the semiconductor device cut along a line III-IV in FIG. 1.

Referring to FIG. 1, the semiconductor device may include the electrical element and the optical element on a substrate 100.

The substrate 100 may be a semiconductor substrate, e.g., a silicon substrate, a germanium substrate and/or a silicon-germanium substrate. In an exemplary embodiment, the substrate 100 may be a single crystalline silicon wafer having a crystal plane {100}. A notch 102 may be disposed at an edge of the single crystalline silicon wafer corresponding to a crystal orientation <011>. The notch 102 may be of various shapes, e.g., a V-shaped groove or a cutting end of the single crystalline silicon wafer.

Hereinafter, a first direction may be defined as a direction substantially perpendicular to an upper surface of the substrate 100, and a second direction may be defined as a direction substantially perpendicular to the first direction and substantially parallel to the crystal orientation <011>. A third direction may be defined as a direction substantially perpendicular to the first direction and substantially parallel to the crystal orientation <010>, and a fourth direction may be defined as a direction substantially perpendicular to both of the first direction and the second direction.

The substrate 100 may be divided into a first region I and a second region II. In an exemplary embodiment, the electrical element may be disposed in the first region I, and the optical element may be disposed in the second region II.

Referring to FIGS. 1 and 2, the electrical element may include a transistor, and/or a plurality of transistors, disposed in the second direction. In an exemplary embodiment, the electrical element may include a buried insulation layer 110, an epitaxial layer 120, a gate structure 130, a spacer 140, a source region 150 and a drain region 160.

The buried insulation layer 110 may be disposed on the substrate 100. The buried insulation layer 110 may include an insulation material. In an exemplary embodiment, the buried insulation layer 110 may include silicon oxide, silicon nitride and/or silicon carbon nitride.

The epitaxial layer 120 may be disposed on the buried insulation layer 110. In an exemplary embodiment, the epitaxial layer 120 may include single crystalline silicon having a crystal orientation substantially the same as that of the substrate 100. In an exemplary embodiment, the epitaxial layer 120 may include single crystalline silicon doped with impurities, e.g., phosphorous (P), bromine (Br), arsenic (As) or carbon (C), and the single crystalline silicon may have a crystal orientation substantially the same as that of the substrate 100.

The gate structure 130 may include a gate insulation layer pattern 133, a gate electrode 135 and a gate mask 137 sequentially stacked on the epitaxial layer 120. The gate insulation layer pattern 133 may include an insulation material, e.g. silicon oxide or a metal oxide. The gate electrode 135 may include doped polysilicon, a metal, a metal nitride and/or a metal silicide. The gate electrode 135 may extend in the fourth direction, that is, in the crystal orientation <110>. The gate mask 137 may include an insulation material, e.g., silicon nitride or silicon oxynitride.

In an exemplary embodiment, the spacer 140 may be a nitride, e.g., silicon nitride, and may be disposed on a sidewall of the gate structure 130.

First and second impurity regions 150, 160 may be disposed at upper portions of the epitaxial layer 120 adjacent to the gate structure 130 and the spacer 140. In an exemplary embodiment, the first and second impurity regions 150, 160 may serve as a source region and a drain region, respectively. That is, the source region 150 and the drain region 160 may be disposed adjacent to the gate electrode 135 in the second direction.

A channel region 170 may be positioned under the gate structure 130 between the source region 150 and the drain region 160. A charge carrier in the channel region 170 may move along the second direction, that is, a direction substantially parallel to the crystal orientation <011>. Thus, the charge carrier can have an improved mobility in the second direction, so that the electrical element can have improved electrical characteristics.

The electrical element may include the transistor as illustrated in FIGS. 1 and 2, however, may not be limited thereto. In an exemplary embodiment, the electrical element may further include, e.g., a capacitor, a bit line and a variety of wires in addition to the transistor. Therefore, the electrical element may include memory devices, e.g., a dynamic random access memory (DRAM) device, flash memory device, a phase-change random access memory (PRAM) device, a magnetic random access memory (MRAM) device, or a resistive random access memory (RRAM) device.

The optical element may include an optical waveguide extending in the third direction. In an exemplary embodiment, the optical element may include a mach-zehnder modulator 300, which may include a first grating coupler 310, a first interferometer 320, a phase converter 340, a second interferometer 360, a second grating coupler 370 and an optical waveguide 330. The mach-zehnder modulator 300 may be disposed on the substrate 100 in the second region II.

In an exemplary embodiment, the first grating coupler 310 may receive an input optical signal from an optical source (not shown), and may be optically connected to other optical components by the optical waveguide 330. The first interferometer 320 may be configured to divide the input optical signal into first and second optical signals that may pass via first and second optical wave paths, respectively, and the first optical wave path may be optically connected to the phase converter 340. The phase converter 340 may convert a phase of the first optical signal. The first optical signal and the second optical signal may be combined at the second interferometer 360, and the modified optical signal may be output to the second grating coupler 370.

In an exemplary embodiment, the optical waveguide 330 and the phase converter 340 may extend in the third direction. Structures of the optical waveguide 330 and the phase converter 340 will now be described with reference to FIG. 2.

Referring to FIG. 2, the optical waveguide 330 may include a first core layer 335 and a first cladding layer structure surrounding the first core layer 335. In an exemplary embodiment, the first cladding layer structure may include a first cladding layer 333 disposed under the first core layer 335 and a second cladding layer 337 disposed on sidewalls and a top surface of the first core layer 335.

The first cladding layer 333 may partially fill a second trench 331 extending in the third direction on the substrate 100. Therefore, the first cladding layer 333 may also extend in the third direction. The first cladding layer 333 may include a material having a reflective index smaller than that of silicon. In an exemplary embodiment, the first cladding layer 333 may include silicon oxide, silicon nitride or silicon carbon nitride. In an exemplary embodiment, the first cladding layer 333 may have a thickness of about 100 nm to about 10 um.

The first core layer 335 extending in the third direction may be disposed on the first cladding layer 333 to partially fill the second trench 331. The first core layer 335 may have a width smaller than that of the first cladding layer 333. In an exemplary embodiment, the first core layer 335 may include crystallized silicon. In an exemplary embodiment, the first core layer 335 may include crystallized silicon doped with impurities, e.g., P, Br, As and/or C. In an exemplary embodiment, the first core layer 335 may have a thickness of about 100 nm to about 400 nm.

The second cladding layer 337 may be disposed on the substrate 100 and the first cladding layer 333 to cover the top surface and the sidewalls of the first core layer 335. The second cladding layer 337 may fill a remaining portion of the second trench 331.

In an exemplary embodiment, the second cladding layer 337 may include a material substantially the same as or similar to that of the first cladding layer 333. Therefore, the first core layer 335 may be surrounded by the first and second cladding layers 333, 337 including the material having a refractive index smaller than that of silicon.

At least a portion of the optical waveguide 330 may extend in the third direction, and may include the first core layer 335 containing crystallized silicon. The first core layer 335 may extend in the third direction, that is, a direction substantially parallel to the crystal orientation <010>.

Figure 19:
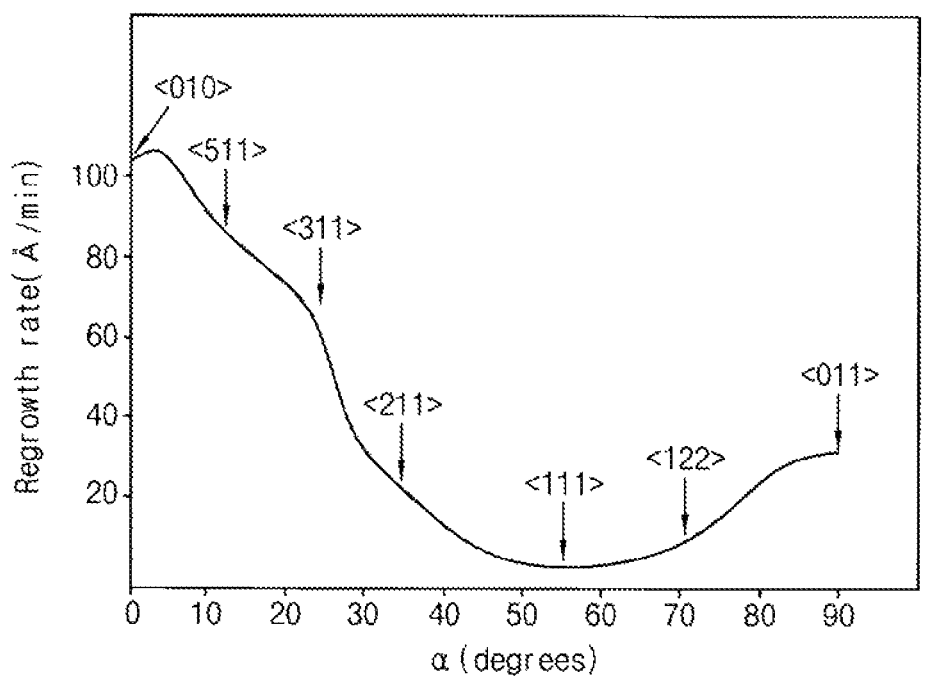
FIG. 19 is a graph showing a regrowth rate of amorphous silicon in a crystallization process with respect to a crystal orientation.

Referring now to FIG. 19, a graph shows the regrowth rate of amorphous silicon in a crystallization process with respect to a crystal orientation.

In the graph, the Y axis represents a regrowth rate of amorphous silicon, and the X axis represents an angle of the crystalline plane with respect to the crystal orientation <100>. The regrowth rate of amorphous silicon was measured on single crystalline silicon having the crystal plane {100} at a temperature of about 550° C.

As illustrated in FIG. 19, in a crystallization process, a regrowth rate of an amorphous silicon layer in the crystal orientation <010> is larger than a regrowth rate of an amorphous silicon layer in the crystal orientation <011>. Therefore, the crystallized silicon grown in the crystal orientation <010> may have an improved crystallinity and a reduced crystalline defect than the crystallized silicon grown in the crystal orientation <011>.

The optical waveguide 330 may include the first core layer 335 including silicon having the improved crystallinity, so that the optical loss generated at the crystalline defect may be reduced, and the optical waveguide 330 may have improved optical characteristics.

The phase converter 340 may include a second core layer 345, a second cladding layer structure surrounding the second core layer 345, third and fourth impurity regions 349, 351, and first and second contacts 353, 355.

The second cladding layer structure may include a third cladding layer 343 and a fourth cladding layer 347. In an exemplary embodiment, the third cladding layer 343 may partially fill a third trench 341 extending in the third direction on the substrate 100, so that the third cladding layer 343 may extend in the third direction.

The second core layer 345 may be disposed on the third cladding layer 343 to partially fill the third trench 341. The second core layer 345 may extend in the third direction. In an exemplary embodiment, the second core layer 345 may also include crystallized silicon. In an exemplary embodiment, the second core layer 345 may include crystallized silicon doped with impurities, e.g., P, Br, As and/or C.

The fourth cladding layer 347 may be disposed on the substrate 100 and the third cladding layer 343 to cover sidewalls and a top surface of the second core layer 345. The fourth cladding layer 347 may be disposed to fill a remaining portion of the third trench 341. In an exemplary embodiment, the third cladding layer 343 and the fourth cladding layer 347 may include a material substantially the same as that of the first cladding layer 333. Therefore, the second core layer 345 may be surrounded by the third and fourth cladding layers 343, 347 including the material having a refractive index smaller than that of silicon.

The third impurity region 349 and the fourth impurity region 351 may be disposed at upper portions of the second core layer 345. In an exemplary embodiment, the third impurity region 349 may be disposed at a first side of the upper portion of the second core layer 345, and the fourth impurity region 351 may be disposed at a second side of the upper portion of the second core layer 345. In an exemplary embodiment, the third impurity region 349 may include n-type impurities, and the fourth impurity region 351 may include p-type impurities.

The first contact 353 and the second contact 355 may be disposed on and through the fourth cladding layer 347. In an exemplary embodiment, the first contact 353 may be disposed through the fourth cladding layer 347 to electrically contact the third impurity region 349. The second contact 355 may be disposed through the fourth cladding layer 347 to electrically contact the fourth impurity region 351. In an exemplary embodiment, the first contact 353 and the second contact 355 may penetrate the fourth cladding layer 347 through openings (not shown) having a rectangular shape when viewed from a top side. In an exemplary embodiment, the first contact 353 and the second contact 355 may include doped polysilicon, a metal, a metal nitride and/or a metal silicide.

The first contact 353 and the second contact 355 may be electrically connected to the electrical element. The electrical element may generate an electrical signal and transmit the electrical signal to the first and second contacts 353, 355 and the first and second contacts 353, 355 may apply a current to the second core layer 345 according to the electrical signal. Depending on the applied current, the refractive index of the second core layer 345 can be changed, and the phase of the optical signal transmitted through the second core layer 345 can be converted. Therefore, the electrical signal of the electrical element can be converted into an optical signal.

Although the mach-zehnder modulator 300 including the optical waveguide 330 and the phase converter 340 are illustrated in FIGS. 1 and 2, the optical element is not limited thereto. That is, the optical element may include other optical elements including the optical waveguide extending in the third direction that corresponds to the crystal orientation <010>.

According to an exemplary embodiment, the semiconductor device may include the electrical element having the gate electrode 135 extending in the fourth direction and the optical element having the optical waveguide 330 extending in the third direction. The electrical element may include the channel region 170 arranged in the crystal orientation <011>, so that the electrical element can have improved electrical characteristics. The optical element may include the optical waveguide 330 extending in the crystal orientation <010>, so that the optical loss due to the crystalline defect can be reduced. Therefore, the optical element can have improved optical waveguide characteristics.

Figure 20:
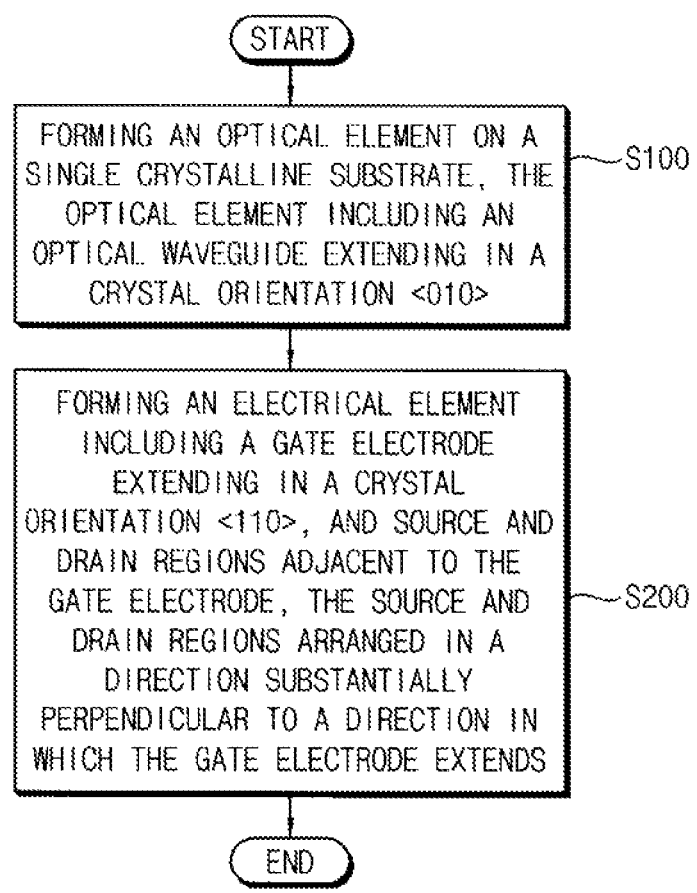
FIG. 20 depicts in block diagram form an overview of a method of manufacturing a semiconductor device including an optical element and an electrical element in accordance with an exemplary embodiment.

FIGS. 3 to 12 are cross-sectional views illustrating a method of manufacturing a semiconductor device including both of an optical element and an electrical element in accordance with an exemplary embodiment. FIGS. 3 to 12 are cross-sectional views illustrating a method of manufacturing the semiconductor device cut along the line III-IV in FIG. 1. FIG. 20 illustrates in block diagram form an overview of a method of manufacturing a semiconductor device including an optical element and an electrical element in accordance with an exemplary embodiment.

Referring first to FIG. 20, an optical element is formed (S100) on a single crystalline substrate, the optical element including an optical waveguide extending in a crystal orientation <010>. An electrical element is formed (S200) including a gate electrode extending in a crystal orientation <110>, and source and drain regions adjacent to the gate electrode, the source and drain regions arranged in a direction substantially perpendicular to a direction in which the gate electrode extends.

Figure 3:
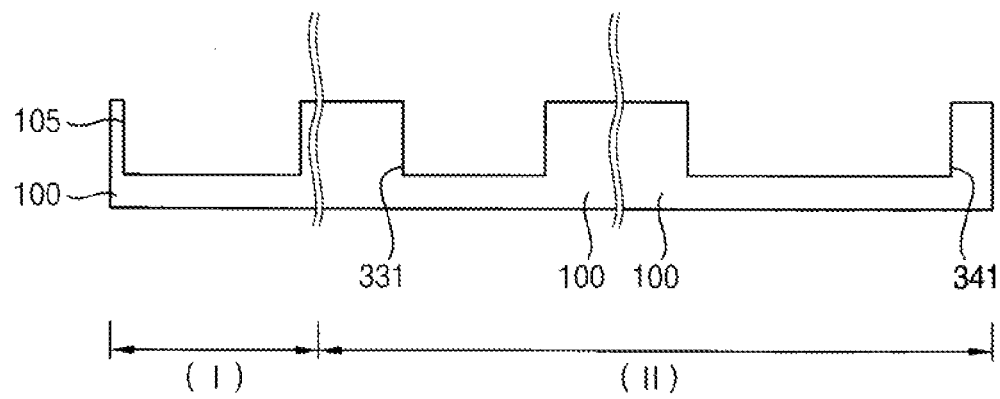
FIGS. 3, 4, 5, 6, 7, 8, 9, 10, 11 and 12 are cross-sectional views illustrating a method of manufacturing a semiconductor device including an optical element and an electrical element in accordance with exemplary embodiments.

Referring now to FIG. 3, first to third trenches 105, 331, 341 may be formed at upper portions of the substrate 100.

The substrate 100 may include a semiconductor substrate, e.g., a silicon substrate, a germanium substrate and/or a silicon-germanium substrate. In an exemplary embodiment, the substrate 100 may include a single crystalline wafer having a crystal plane {100}. The substrate 100 may be divided into a first region I and a second region II.

Hereinafter, a first direction may be defined as a direction substantially perpendicular to an upper surface of the substrate 100, and a second direction may be defined as a direction substantially perpendicular to the first direction and substantially parallel to a crystal orientation <011>. A third direction may be defined as a direction substantially perpendicular to the first direction and substantially parallel to a crystal orientation <010>, and a fourth direction may be defined as a direction substantially perpendicular to both of the first direction and the second direction.

In an exemplary embodiment, a first mask may be formed on the substrate 100, an upper portion of the substrate 100 may be etched using the first mask as an etching mask to form the first trench 105, the second trench 331 and the third trench 341.

The first trench 105 may be formed in the first region I to extend in the fourth direction, and a plurality of first trenches 105 may be arranged in the second direction. The second trench 331 and the third trench 341 may be formed in the second region II to extend in the third direction. In an exemplary embodiment, the third trench 341 may have a width larger than that of the second trench 331, and may have a depth substantially the same as that of the second trench 331.

Figure 4:
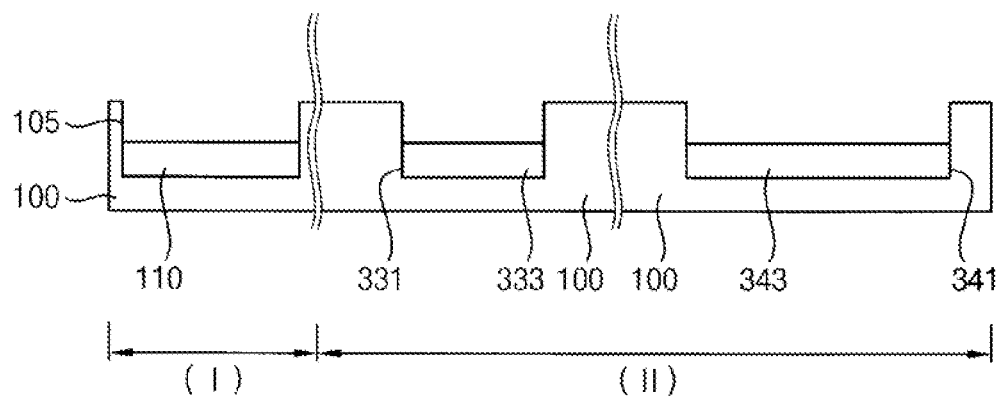

Referring to FIG. 4, a buried insulation layer 110, a first cladding layer 333 and a second cladding layer 343 may be formed to partially fill the first trench 105, the second trench 331 and the third trench 341, respectively.

An insulation layer may be formed on the substrate 100 and inner walls of the first to third trenches 105, 331, 341, and then the insulation layer may be partially removed to form the buried insulation layer 110 partially filling the first trench 105, the first cladding layer 333 partially filling the second trench 331 and the third cladding layer 343 partially filling the third trench 341. In an exemplary embodiment, the insulation layer may be formed using silicon oxide, silicon nitride and/or silicon carbon nitride by a chemical vapor deposition (CVD) process, a sputtering process, an atomic layer deposition (ALD) process or a plasma enhanced CVD (PECVD) process.

In an exemplary embodiment, the first cladding layer 333 and the third cladding layer 343 may extend in the third direction according to the second trench 331 and the third trench 341, respectively. The buried insulation layer 110 may extend in the fourth direction according to the first trench 105.

Figure 5:
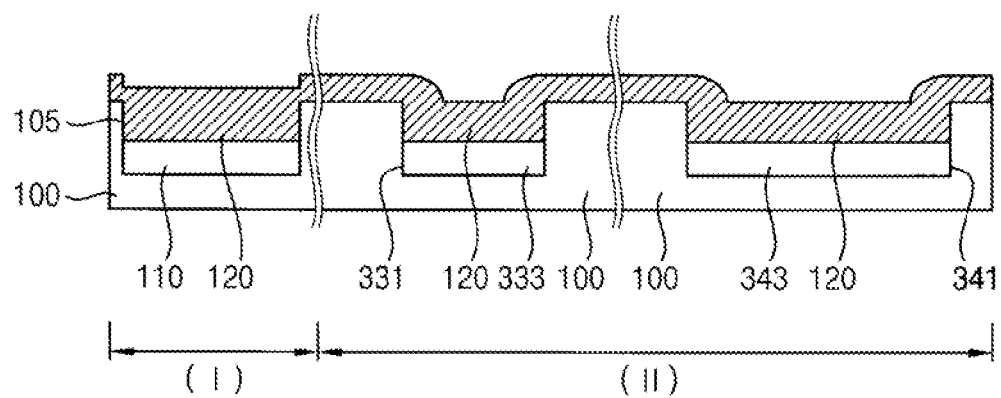

Referring to FIG. 5, an epitaxial layer 120 may be formed on the substrate 100, the buried insulation layer 110 and the first and third cladding layers 333, 343.

An amorphous layer may be formed on the substrate 100, the buried insulation layer 110 and the first and third cladding layers 333, 343, and then the amorphous layer may be crystallized to form the epitaxial layer 120. In an exemplary embodiment, the amorphous layer may be formed using silicon by a CVD process, a sputtering process and/or an ALD process.

The crystallization process may include a laser epitaxial growth (LEG) process, a solid phase epitaxy (SPE) process or a selective epitaxial growth (SEG) process. That is, the amorphous layer may be crystallized using a thermal energy of a rapid thermal annealing process or a flash rapid thermal annealing process, or a laser energy such as an excimer laser or a neodymium-doped yttrium aluminum garnet (ND-YAG) laser. In an exemplary embodiment, the epitaxial layer 120 may be formed to include single crystalline silicon having a crystalline orientation substantially the same as that of the substrate 100.

As illustrated in FIG. 19, in a crystallization process, a regrowth rate of an amorphous silicon layer may vary depending on a crystal orientation. That is, a regrowth rate of the amorphous silicon layer in the crystal orientation <010> is larger than a regrowth rate of the amorphous silicon layer in the crystal orientation <110>. Therefore, the crystallized silicon grown in the crystal orientation <010> can have an improved crystallinity and a reduced crystalline defect than the crystallized silicon grown in the crystal orientation <011>.

Figure 6:
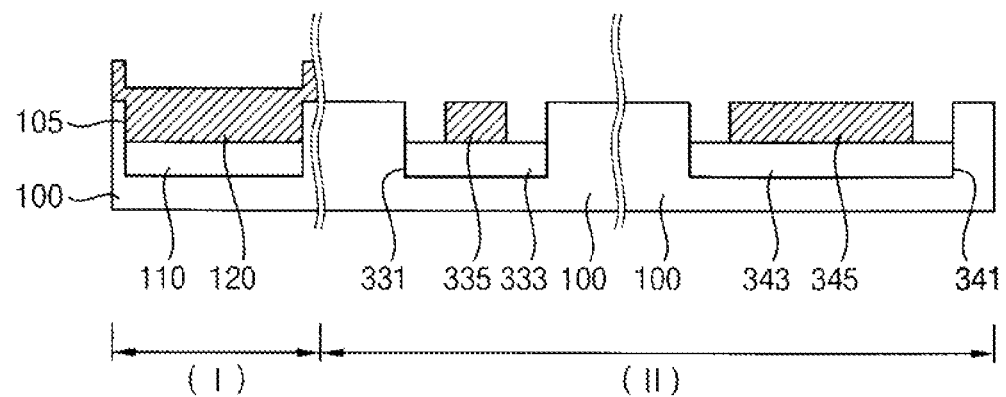

Referring to FIG. 6, the epitaxial layer 120 may be partially removed to form first and second core layers 335, 345.

In an exemplary embodiment, the first and second core layers 335, 345 may be formed on the first and third cladding layers 333, 343, respectively. The first core layer 335 and the second core layer 345 may extend in the third direction substantially parallel to the crystal orientation <010> of the epitaxial layer 120.

Figure 7:
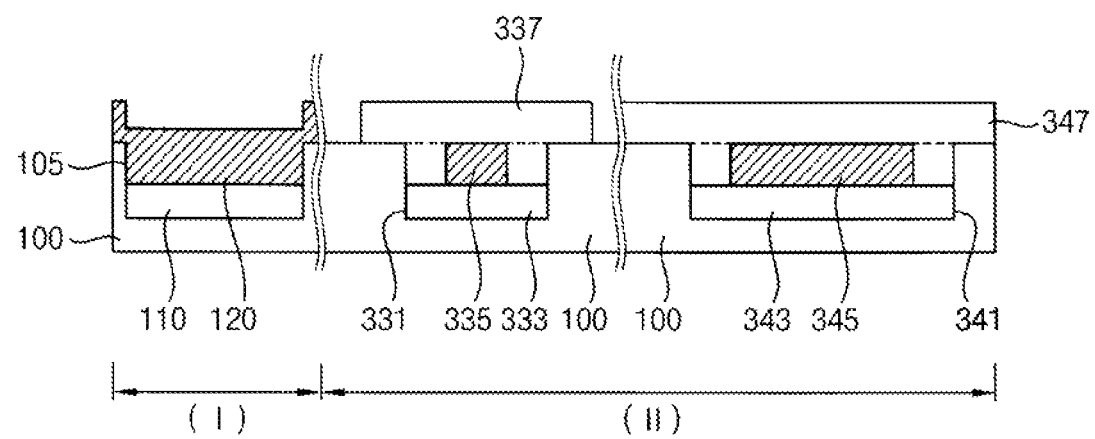

Referring to FIG. 7, a second cladding layer 337 and a fourth cladding layer 347 may be formed on the substrate 100.

In an exemplary embodiment, the second cladding layer 337 may be formed on the substrate 100 and the first cladding layer 333 to cover the first core layer 335, and the fourth cladding layer 347 may be formed on the substrate 100 and the third cladding layer 343 to cover the second core layer 345. In an exemplary embodiment, the second and fourth cladding layers 337, 347 may be formed using materials substantially the same as those of the first and third cladding layers 333, 343.

Figure 8:
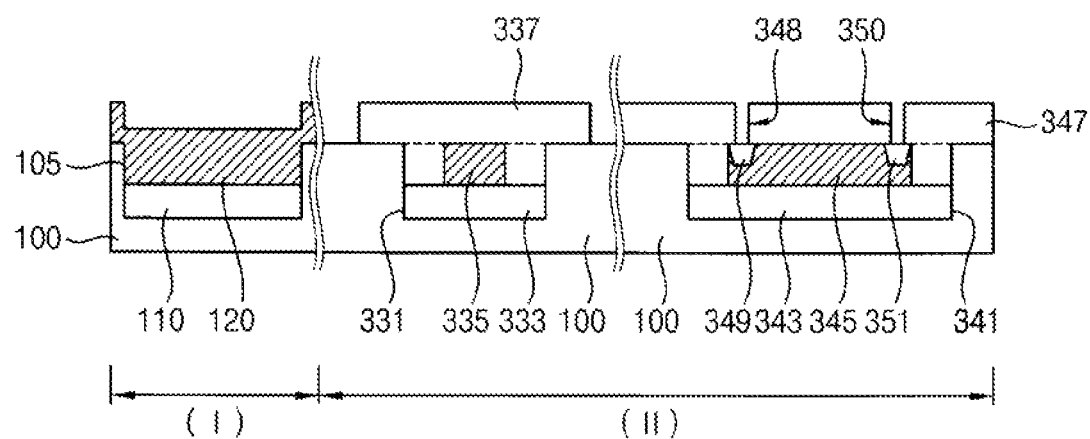

Referring to FIG. 8, first and second openings 348, 350 may be formed through the fourth cladding layer 347, and third and fourth impurity regions 349, 351 may be formed at upper portions of the second core layer 345 exposed by the first and second openings 348, 350, respectively.

In an exemplary embodiment, the first and second openings 348, 350 may have a rectangular shape, when viewed from a top side. Impurities may be implanted into the second core layer 345 through the first and second openings 348, 350. In an exemplary embodiment, n-type impurities may be implanted through the first opening 348 to form the third impurity region 349 at a first side of the upper portion of the second core layer 345, and p-type impurities may be implanted through the second opening 350 to form the fourth impurity region 351 at a second side of the upper portion of the second core layer 345.

Figure 9:
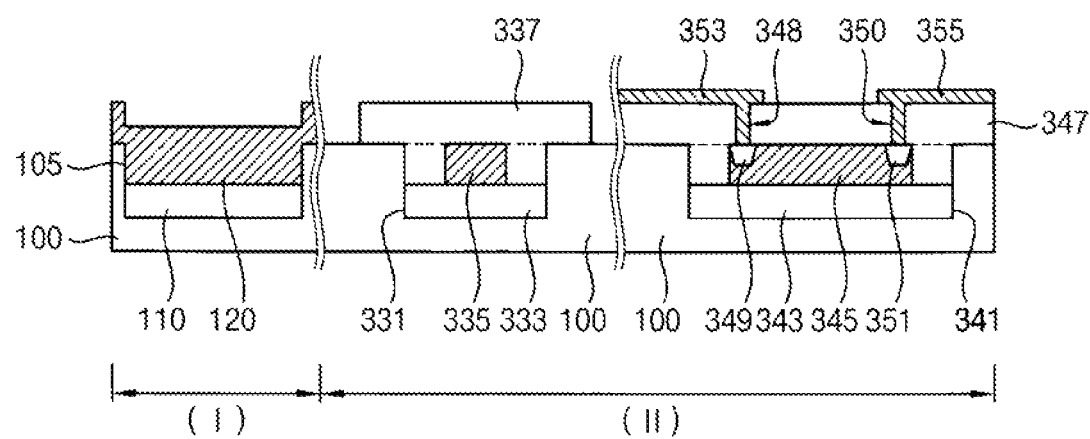

Referring to FIG. 9, first and second contacts 353, 355 may be formed on the third and fourth impurity regions 349, 351 and the fourth cladding layer 347 to fill the first and second openings 348, 350, respectively.

A conductive layer may be formed on the fourth cladding layer 347, and then the conductive layer may be patterned to form the first and second contacts 353, 355. In an exemplary embodiment, the conductive layer may be formed using doped polysilicon, a metal, a metal nitride and/or a metal silicide by a CVD process, a sputtering process, an ALD process or a PECVD process.

The first contact 353 may be electrically connected to the third impurity region 349, and the second contact 355 may be electrically connected to the fourth impurity region 351.

Figure 10:
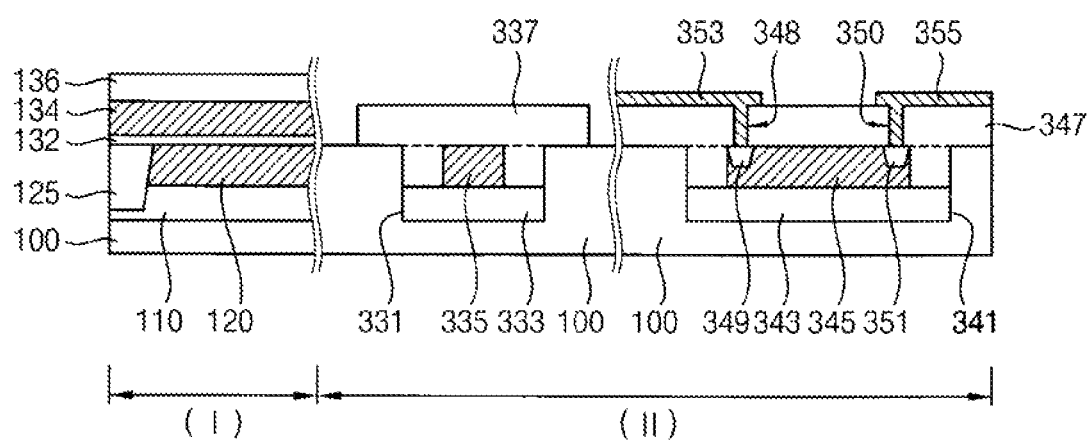

Referring to FIG. 10, an isolation layer 125 may be formed, and then a gate insulation layer 132, a gate conductive layer 134 and a gate mask layer 136 may be sequentially stacked on the isolation layer 125 and the epitaxial layer 120.

The epitaxial layer 120 and the buried insulation layer 110 may be partially removed to form a recess (not shown) in the first region I, and then an insulation material may fill the recess to form the isolation layer 125.

The gate insulation layer 132 may be formed on the isolation layer 125 and the epitaxial layer 120 using an insulation material, e.g., silicon oxide, silicon oxy nitride, a metal oxide. The gate conductive layer 134 may be formed on the gate insulation layer 132 using doped polysilicon, a metal, a metal nitride and/or a metal silicide. The gate mask layer 136 may be formed on the gate conductive layer 134 using silicon nitride or silicon oxynitride.

Figure 11:
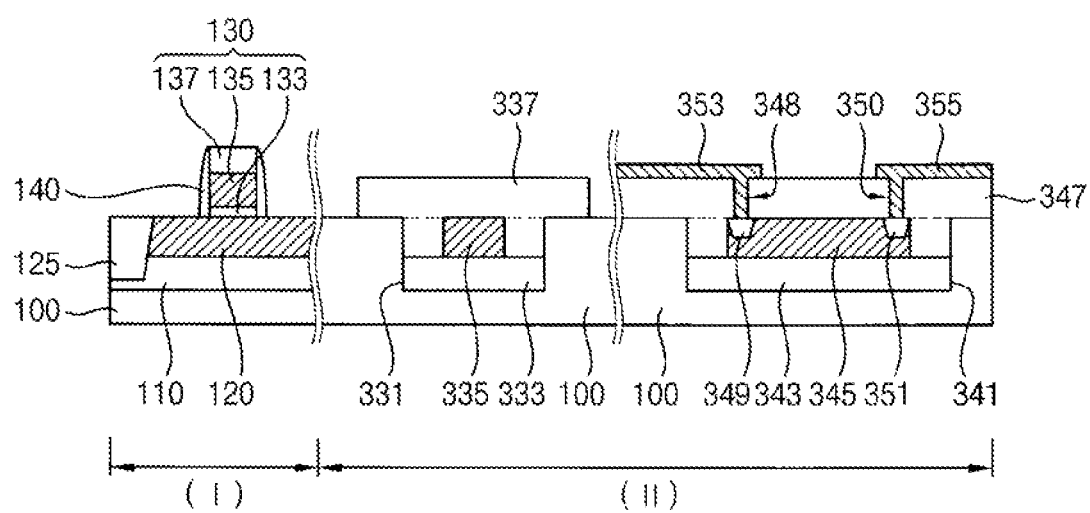

Referring to FIG. 11, a gate structure 130 may be formed on the epitaxial layer 120, and a spacer 140 may be formed on a sidewall of the gate structure 130.

The gate insulation layer 132, the gate conductive layer 134 and the gate mask layer 136 may be partially removed to form a gate insulation layer pattern 133, a gate electrode 135 and a gate mask 137, respectively. The gate insulation layer pattern 133, the gate electrode 135 and the gate mask 137 may define the gate structure 130. The gate conductive layer 134 may extend in the fourth direction.

A spacer layer including, e.g., silicon nitride or silicon oxynitride may be formed on the substrate 100 to cover the gate structure 130, and then the spacer layer may be partially removed to form the spacer 140 on the sidewall of the gate structure 130.

Figure 12:
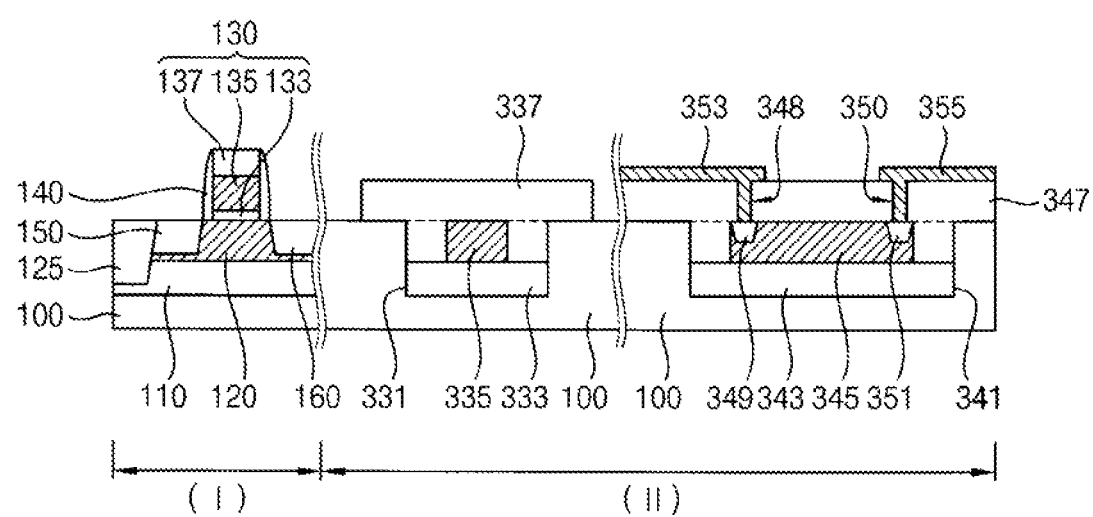

Referring to FIG. 12, first and second impurity regions 150, 160 may be formed at upper portions of the epitaxial layer 120 adjacent to the gate structure 130 and the spacer 140.

Impurities may be implanted into the epitaxial layer 120 using the gate structure 130 and the spacer 140 as a mask, thereby forming the first and second impurity regions 150, 160. In an exemplary embodiment, the first and second impurity regions 150, 160 may serve as a source region and a drain region, respectively. Therefore, the source region 150 and the drain region 160 may be formed adjacent to the gate electrode 135 in the second direction.

A capacitor, a bit line and/or wires may be further formed, so that the electrical element, e.g., memory devices may be completed.

By above mentioned process, the semiconductor device including the electrical element having the gate electrode 135 extending in the fourth direction in the first region I and the optical element having the optical waveguide 330 extending in the third direction in the second region II may be completed. The optical waveguide 330 may extend in the direction substantially parallel to the crystal orientation <010>, so that the optical element can have improved optical waveguide characteristics.

Figure 13:
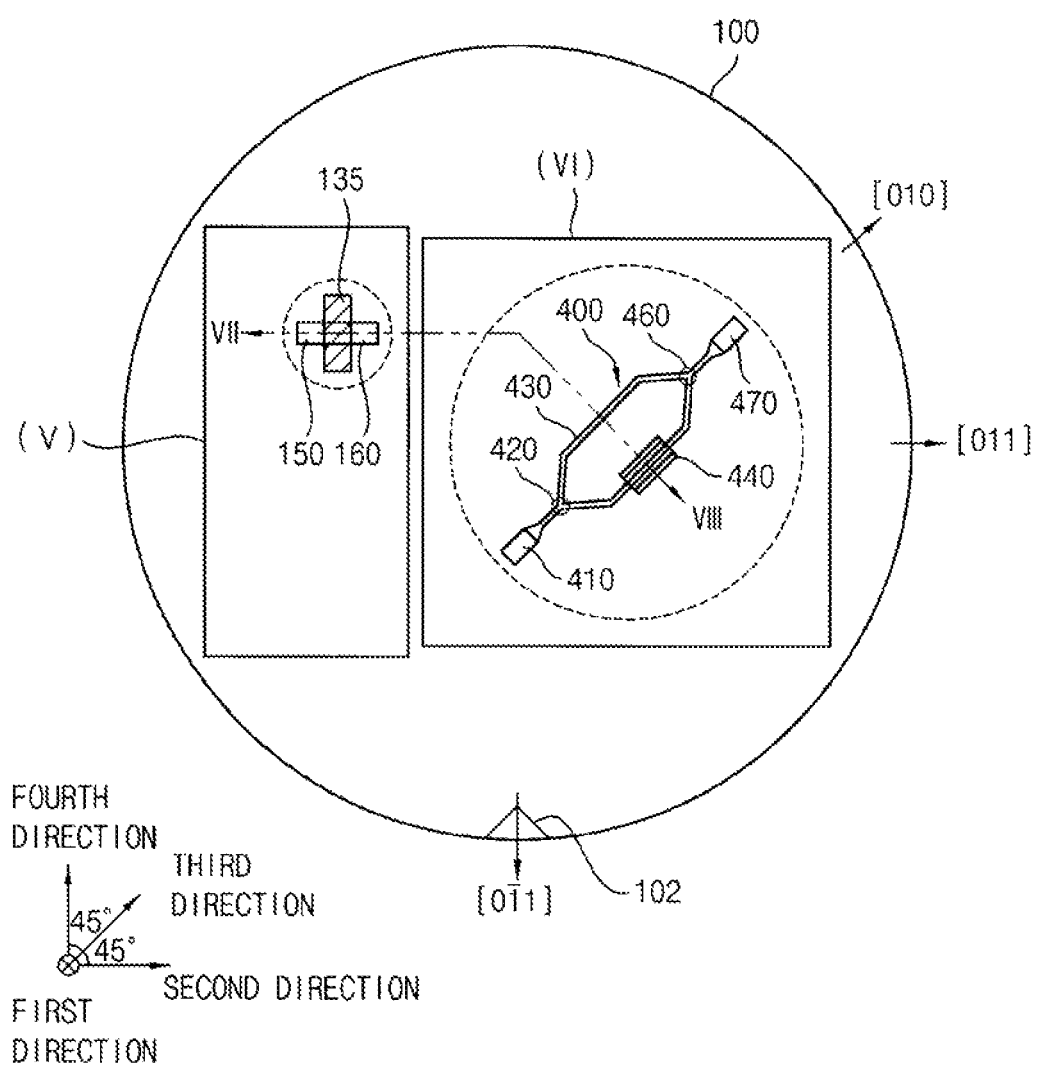
FIG. 13 is a plan view illustrating a semiconductor device including an optical element and an electrical element in accordance with an exemplary embodiment.
Figure 14:
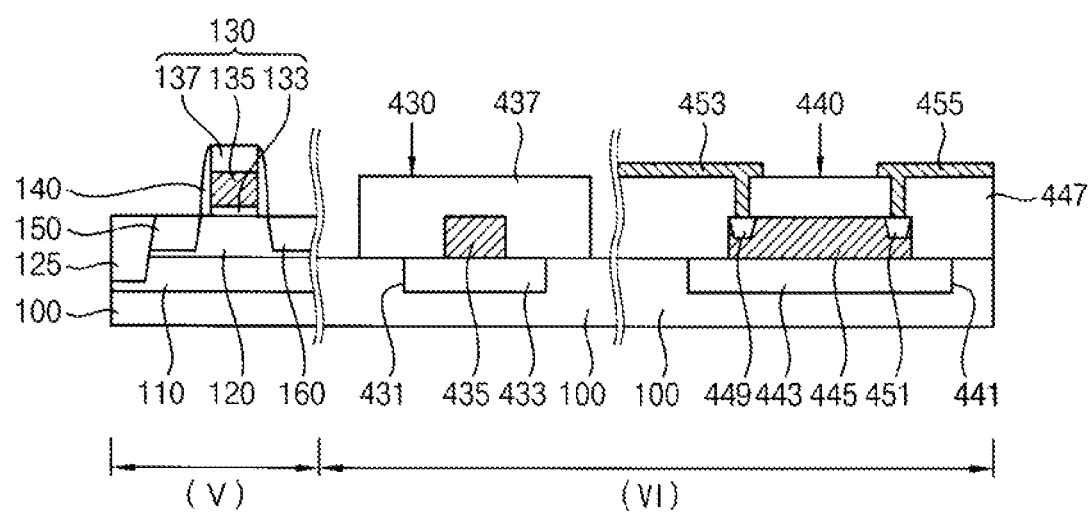
FIG. 14 is a cross-sectional view illustrating the semiconductor device cut along a line VII-VIII in FIG. 13.

FIG. 13 is a plan view illustrating a semiconductor device including an optical element and an electrical element in accordance with an exemplary embodiment, and FIG. 14 is a cross-sectional view illustrating the semiconductor device cut along a line VII-VIII in FIG. 13.

Referring to FIG. 13, the semiconductor device may include both of an electrical element and an optical element on a substrate 100.

The substrate 100 may include a semiconductor substrate, e.g., a silicon substrate, a germanium substrate and/or a silicon-germanium substrate. In an exemplary embodiment, the substrate 100 may include a single crystalline silicon wafer having a crystal plane {100}. Hereinafter, the semiconductor device may be described using first to fourth directions substantially the same as the first to fourth directions described with reference to FIG. 1. The second and fourth directions may be substantially parallel to a crystal orientation <011>, and the third direction may be substantially parallel to a crystal orientation <010>.

The substrate 100 may be divided into a third region V and a fourth region VI. The electrical element in the third region V may be substantially the same as or similar to the electrical element in the first region I illustrated with reference to FIGS. 1 and 2, so that further detailed descriptions thereof have been omitted.

The optical element disposed in the fourth region VI may include an optical waveguide 430 extending in the third direction. In an exemplary embodiment, the optical element may include a mach-zehnder modulator 400, and the mach-zehnder modulator 400 may include a first grating coupler 410, a first interferometer 420, a phase converter 440, a second interferometer 460, a second grating coupler 470 and an optical waveguide 430.

In an exemplary embodiment, the optical waveguide 430 and the phase converter 440 may extend in the third direction, and structures of the optical waveguide 430 and the phase converter 440 are described with reference to FIG. 14.

Referring to FIG. 14, the optical waveguide 430 may include a first core layer 435 and first and second cladding layers 433, 437 surrounding the first core layer 435. The optical waveguide 430 is substantially similar to the optical waveguide 330 illustrated with reference to FIGS. 1 and 2, except that the first cladding layer 433 may sufficiently fill the second trench 431 at an upper portion of the substrate 100.

Also, the phase converter 440 is substantially similar to the phase converter 340 illustrated with reference to FIGS. 1 and 2, except that the third cladding layer 443 may sufficiently fill the third trench 441 at an upper portion of the substrate 100.

According to an exemplary embodiment, the optical element may include the optical waveguide 430 and the phase converter 440 which may extend in the third direction and include the first and second core layers 435, 445. As mentioned above, in a crystallization process, a regrowth rate of an amorphous silicon layer in the crystal orientation <010> is larger than a regrowth rate of the amorphous silicon layer in the crystal orientation <011>. Therefore, the crystallized silicon grown in the crystal orientation <010> can have an improved crystallinity and a reduced crystalline defect than the crystallized silicon grown in the crystal orientation <011>. Therefore, the optical element can have improved optical waveguide characteristics.

FIGS. 15 to 18 are cross-sectional views illustrating a method of manufacturing a semiconductor device including both of an optical element and an electrical element in accordance with an exemplary embodiment.

Hereinafter, the semiconductor device is described using first to fourth directions substantially the same as the first to fourth directions described with reference to FIG. 1. The second and fourth directions may be substantially parallel to a crystal orientation <011>, and the third direction may be substantially parallel to a crystal orientation <010>.

Figure 15:
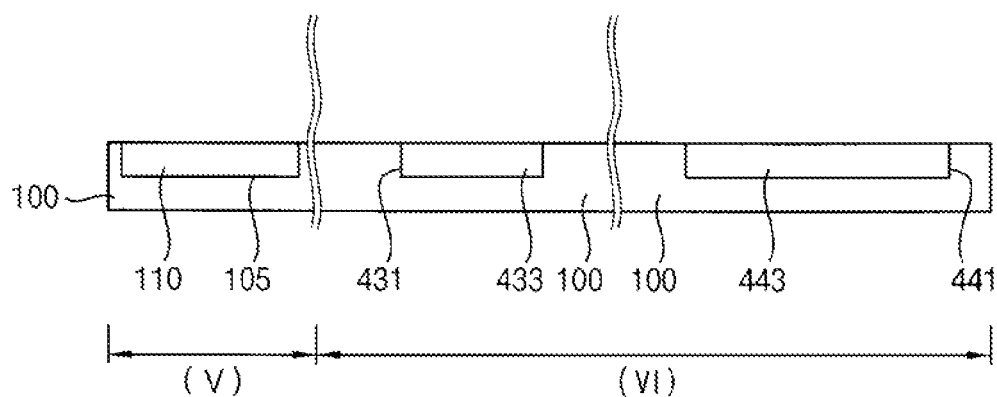
FIGS. 15, 16, 17 and 18 are cross-sectional views illustrating a method of manufacturing a semiconductor device including an optical element and an electrical element in accordance with other exemplary embodiments.

Referring to FIG. 15, a buried insulation layer 110, a first cladding layer 433 and a second cladding layer 443 may be formed to sufficiently fill the first trench 105, the second trench 431 and the third trench 441, respectively.

A substrate 100 may include a single crystalline wafer having a crystal plane {100}, and may be divided into a third region V and a fourth region VI.

Upper portions of the substrate 100 may be etched to form the first trench 105 in the third region V, and the second and third trenches 431, 441 in the fourth region VI. In an exemplary embodiment, the first trench 105 may be formed to extend in the fourth direction, and the second trench 431 and the third trench 441 may be formed to extend in the third direction.

An insulation layer including silicon oxide, silicon nitride and/or silicon carbon nitride may be formed on the substrate 100 to fill the first to third trenches 105, 431, 441, and then the insulation layer may be partially removed to form the buried insulation layer 110 sufficiently filling the first trench 105, the first cladding layer 433 sufficiently filling the second trench 431 and the third cladding layer 343 sufficiently filling the third trench 441.

In an exemplary embodiment, the first cladding layer 433 and the third cladding layer 443 may extend in the third direction according to the second trench 431 and the third trench 441, respectively. The buried insulation layer 110 may extend in the fourth direction according to the first trench 105.

Figure 16:
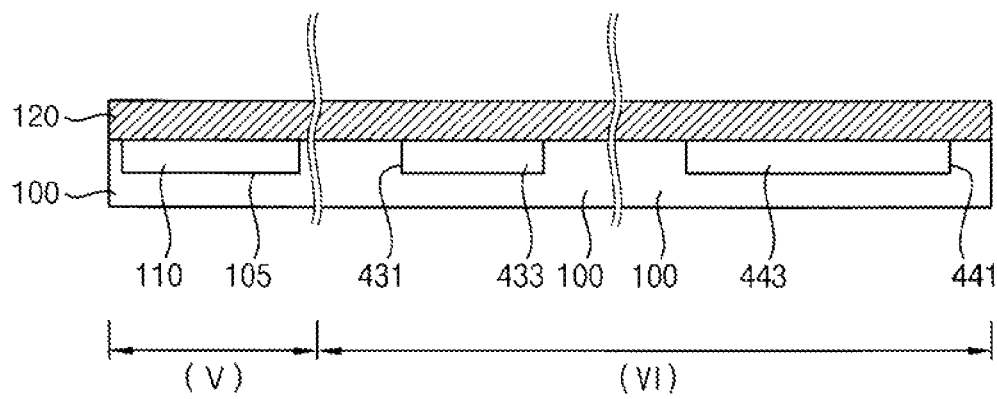

Referring to FIG. 16, an epitaxial layer 120 may be formed on the substrate 100, the buried insulation layer 110 and the first and third cladding layers 433, 443.

An amorphous layer may be formed on the substrate 100, the buried insulation layer 110 and the first and third cladding layers 433, 443, and then the amorphous layer may be crystallized to form the epitaxial layer 120. The crystallization process may be substantially the same as the crystallization process illustrated with reference to FIG. 5.

As illustrated in FIG. 19, in a crystallization process, a regrowth rate of an amorphous silicon layer in the crystal orientation <010> is larger than a regrowth rate of the amorphous silicon layer in the crystal orientation <011>. Therefore, the crystallized silicon grown in the crystal orientation <010> can have an improved crystallinity and a reduced crystalline defect than the crystallized silicon grown in the crystal orientation <011>.

Figure 17:
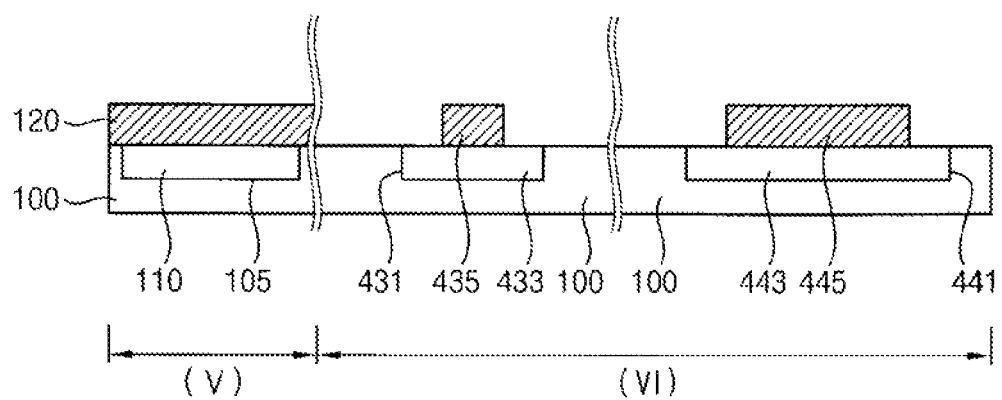

Referring to FIG. 17, the epitaxial layer 120 may be partially removed to form first and second core layers 435, 445.

In an exemplary embodiment, the first and second core layers 435, 445 may be formed on the first and third cladding layer 433, 443. The first core layer 435 and the second core layer 445 may extend in the third direction substantially parallel to the crystal orientation <010> of the epitaxial layer 120.

Figure 18:
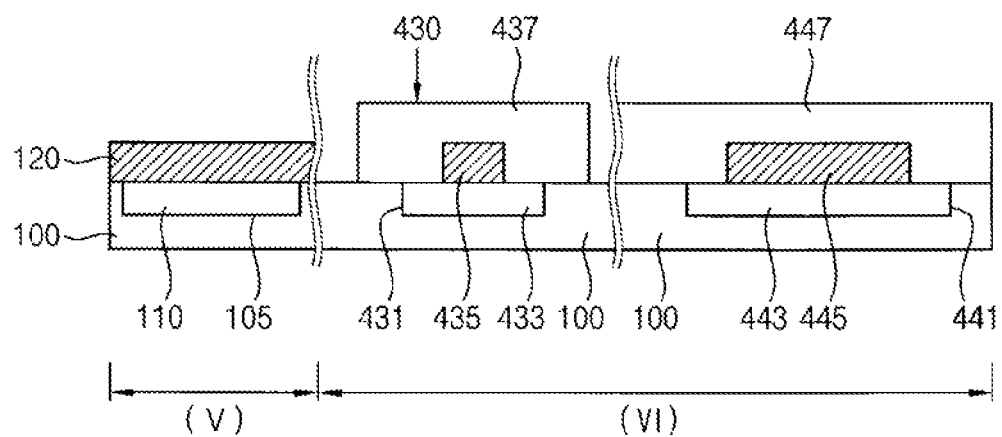

Referring to FIG. 18, a second cladding layer 437 and a fourth cladding layer 447 may be formed on the substrate 100.

In an exemplary embodiment, the second cladding layer 437 may be formed on the substrate 100 and the first cladding layer 433 to cover sidewalls and a top surface of the first core layer 435, and the fourth cladding layer 447 may be formed on the substrate 100 and the third cladding layer 443 to cover sidewalls and a top surface of the second core layer 445.

Then, processes substantially the same as or similar to those illustrated with reference to FIGS. 8 to 12 may be performed to complete the semiconductor device. Thus, detailed explanations thereon are omitted here.

By above mentioned process, the semiconductor device including the electrical element having the gate electrode 135 extending in the fourth direction in the third region V and the optical element having the optical waveguide 430 extending in the third direction in the fourth region VI may be completed. The optical waveguide 430 may extend in the direction substantially parallel to the crystal orientation <010>, so that the optical element may have improved optical waveguide characteristics.

According to an exemplary embodiment, a semiconductor device may include an electrical element having a gate electrode extending in a direction substantially perpendicular to a crystal orientation <011> and an optical element having an optical waveguide extending in a direction substantially parallel to a crystal orientation <010>. Thus, the electrical element may include a channel region arranged in the crystal orientation <011>, thereby having improved electrical characteristics. Additionally, an optical loss due to a crystalline defect in the optical element can be reduced so that the optical element can have improved optical waveguide characteristics.

The foregoing is illustrative of exemplary embodiments of the present invention and is not to be construed as limiting thereof. Although exemplary embodiments of the present invention have been described, those skilled in the art will readily appreciate that many modifications are possible in the exemplary embodiments without materially departing from the novel teachings and advantages of the present invention. Accordingly, all the exemplary embodiments, and all such modifications, are intended to be included within the scope of the present invention as defined in the following claims.

What is claimed is:

1. A semiconductor device, comprising:
 a single crystalline substrate;
 an electrical element on the single crystalline substrate, the electrical element including a gate electrode extending in a crystal orientation <110> and source and drain regions adjacent to the gate electrode, the source region and the drain region arranged in a direction substantially perpendicular to a direction in which the gate electrode extends; and
 an optical element on the single crystalline substrate, the optical element including:
  an optical waveguide extending in a crystal orientation <010>,
  an input grating coupler, and
  an output grating coupler, a linear direction between the input grating coupler and the output grating coupler being substantially 45° oblique from a linear direction between the source region and the drain region.

2. The semiconductor device of claim 1, wherein the optical waveguide comprises a core layer and a cladding layer, the core layer comprising crystallized silicon, and the cladding layer surrounding the core layer.

3. The semiconductor device of claim 2, wherein the cladding layer comprises a material having a refractive index smaller than that of the core layer.

4. The semiconductor device of claim 2, wherein the cladding layer comprises silicon oxide, silicon nitride or silicon carbon-nitride.

5. The semiconductor device of claim 2, wherein the core layer is doped with impurities including phosphorous, bromine, arsenic or carbon.

6. A semiconductor device, comprising:
 a single crystalline substrate;
 an electrical element on the single crystalline substrate, the electrical element including a gate electrode extending in a crystal orientation <110> and source and drain regions adjacent to the gate electrode, the source region and the drain region arranged in a direction substantially perpendicular to a direction in which the gate electrode extends; and an optical element on the single crystalline substrate, the optical element including an optical waveguide extending in a crystal orientation <010>, wherein the optical element further comprises grating couplers, a phase converter and interferometers which are optically connected with the optical waveguide.

7. A semiconductor device, comprising:

a single crystalline substrate;

an electrical element on the single crystalline substrate, the electrical element including a gate electrode extending in a crystal orientation <110> and source and drain regions adjacent to the gate electrode, the source region and the drain region arranged in a direction substantially perpendicular to a direction in which the gate electrode extends;

an optical element on the single crystalline substrate, the optical element including an optical waveguide extending in a crystal orientation <010>; and an epitaxial layer on the single crystalline substrate, wherein the gate electrode is on the epitaxial layer, and the source region and the drain region are at upper portions of the epitaxial layer.

8. The semiconductor device of claim 7, wherein the optical waveguide comprises a material substantially the same as that of the epitaxial layer.

9. A semiconductor device, comprising:

a single crystalline silicon wafer having a first region and a second region;

an amorphous silicon layer on the single crystalline silicon wafer;

an electrical element disposed in the first region; and an optical element disposed in the second region;

wherein the optical element comprises an optical waveguide having an optical waveguide core formed by epitaxial regrowth of the amorphous silicon layer, the optical waveguide core extending in a direction of optimum regrowth of the amorphous silicon layer.

10. The semiconductor device of claim 9, wherein the optical element further comprises:

a first grating coupler responsive to an input optical signal from an optical source, a first interferometer configured to divide the input optical signal into a first optical signal and a second optical signal that pass to a first optical wave path and a second optical wave paths, respectively, the first optical wave path being optically connected to a phase converter configured to convert a phase of the first optical signal, the second optical wave path being through the optical waveguide, a second interferometer configured to combine the first optical signal and the second optical; and a second grating coupler configured to output a combined first optical signal and second optical signal.

11. The semiconductor device of claim 10, wherein the phase converter comprises a crystallized silicon core that extends in a same direction as the optical waveguide.

12. The semiconductor device of claim 11, wherein the crystallized silicon core is responsive to an electrical signal from the electrical element, such that an electrical current applied to the crystallized silicon core can control a refractive index of the second core for converting a phase of the first optical signal.

13. The semiconductor device of claim 9, wherein the electrical element comprises a transistor having a source, a drain, and a channel between the source and drain that extends in a direction from the first region towards the second region.

\* \* \* \* \*